United States Patent
Orio

(10) Patent No.: US 8,266,511 B2
(45) Date of Patent: Sep. 11, 2012

(54) DECODING DEVICE AND DECODING METHOD

(75) Inventor: Masao Orio, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 1196 days.

(21) Appl. No.: 11/907,588

(22) Filed: Oct. 15, 2007

(65) Prior Publication Data

US 2008/0092028 A1 Apr. 17, 2008

(30) Foreign Application Priority Data

Oct. 13, 2006 (JP) ................................ 2006-279427

(51) Int. Cl.
*H03M 13/00* (2006.01)

(52) U.S. Cl. ........................................ 714/796; 714/795

(58) Field of Classification Search .................. 714/796, 714/755, 790, 795, 746, 794; 375/262, 341
See application file for complete search history.

(56) References Cited

U.S. PATENT DOCUMENTS

| | | | | |
|---|---|---|---|---|
| 6,637,004 B1 * | 10/2003 | Mizuno et al. | ................ | 714/796 |
| 7,003,717 B2 * | 2/2006 | Kuwazoe et al. | ............. | 714/792 |
| 7,127,443 B2 * | 10/2006 | Gueguen et al. | ...................... | 1/1 |
| 7,162,675 B2 * | 1/2007 | Das et al. | ...................... | 714/751 |
| 7,277,508 B2 * | 10/2007 | Berens et al. | ................. | 375/341 |
| 7,434,148 B2 * | 10/2008 | Wang et al. | .................... | 714/794 |
| 7,458,008 B2 * | 11/2008 | Wang et al. | .................... | 714/796 |
| 7,797,618 B2 * | 9/2010 | Wang et al. | .................... | 714/795 |
| 7,913,153 B2 * | 3/2011 | Orio | .............................. | 714/794 |
| 2004/0151259 A1 | 8/2004 | Berens et al. | | |

FOREIGN PATENT DOCUMENTS

JP 2004-147329 5/2004

OTHER PUBLICATIONS

Japanese Official Action—JP 2006-279427—Jan. 4, 2011.
Petteri Luukkanen et al., "Comparison of Optimum and Sub-Optimum Turbo Decoding Schemes in $3^{rd}$ Generation cdma2000 Mobile System", 0-7803-5668-3/99$10.00, IEEE., 1999, pp. 1-5.
Alexander Worm et al., "Turbo-Decoding Without SNR Estimation", IEEE Communications Letter, vol. 4, No. 6, Jun. 2000, pp. 1-3.
Mohammad Ali Khalighi, "Effect of Mismatched SNR on the Performance of Log-MAP Turbo Detector", IEEE Transactions of Vehicular Technology, Vo. 52, No. 5, Sep. 2003, pp. 1-12.
S. J. Park, "Combined Max-Log MAP and Log-MAP of turbo codes", Electronics Letters $19^{th}$ Feb. 2004, vol. 40, No. 4, p. 1 and 2.
Chun Ling Kei et al., "A Class of Switching Turbo Decoders against Severe SNR Mismatch", IEEE Dept., Hong Kong Univ. of Science and Technology, Hong Kong S.A.R., China, 2002, pp. 1-4. 0-7803-7467-3/02/, IEEE.

* cited by examiner

*Primary Examiner* — Phung M Chung
(74) *Attorney, Agent, or Firm* — Young & Thompson

(57) ABSTRACT

A decoding device includes a BM calculator calculating a branch metric in a Log-MAP algorithm from received data and extrinsic information, an ACS operator calculating a maximum value of a path metric based on the branch metric, a correction term calculator calculating a Jacobian correction value of the path metric, and a correction operator correcting the path metric by adjusting a value of the Jacobian correction value based on a size of the received data and adding the adjusted correction value to the maximum value.

8 Claims, 14 Drawing Sheets

$$\log\left[\sum_i e^{A_i}\right] = \boxed{A_M}_{\text{MAXIMUM VALUE}} + \boxed{\log\left(1 + \sum_{A_i \neq A_M} e^{-|A_i - A_M|}\right)}_{\text{JACOBIAN CORRECTION TERM}} \times \boxed{\prod_r F(x_r)}_{\text{ADJUSTMENT COEFFICIENT}}$$

$$A_M = \max_i A_i$$

Fig. 4

DECODING DEVICE AND DECODING METHOD

BACKGROUND OF THE INVENTION

1. Field of the Invention

The present invention relates to an arithmetic circuit for correcting an approximate value that is computed by the Max-Log-MAP algorithm based on the Log-MAP algorithm.

2. Description of Related Art

In digital communications system, an error correcting code for correcting an error occurring in a transmission line is used. Particularly in mobile communication systems where the radio field intensity varies drastically due to fading and thereby an error is likely to occur, high correction capability is required for error correcting codes. Turbo codes, which are one example of error correcting codes, are notable as the codes having the error correction capability which is close to the Shannon limit and employed in the W-CDMA (Wideband Code Division Multiple Access) or CDMA-2000 as the third-generation mobile communication system, for example.

FIG. 8 is a block diagram showing the structure of a typical encoding device for generating turbo codes. The encoding device 101 may be placed on the transmitting side of a communication system in order to encode information bits (systematic bits: systematic portion) U as pre-encoded data into turbo codes as parallel concatenated convolutional codes (PCCCs) and output the turbo codes to the outside such as a transmission line. The turbo codes are not limited to the parallel concatenated convolutional codes and may be any codes which can be turbo-decoded, such as serial concatenated convolutional codes.

The encoding device 101 includes a first encoder 102 and a second encoder 103 which serve as systematic convolutional coders, and an interleaver 104 which interleaves (i.e. rearranges) data as shown in FIG. 8.

The first encoder 102 encodes input systematic portion U to generate redundancy bits (hereinafter as the parity bits) 1P and outputs the parity bits 1P to the outside. The interleaver 104 rearranges each bit of the input systematic portion U into a prescribed interleaved pattern to generate a systematic portion $U^{int}$ and outputs the generated systematic portion $U^{int}$ to the second encoder 103. The second encoder 103 encodes the systematic portion $U^{int}$ to generate parity bits 2P and outputs the parity bits 2P to the outside.

In sum, the encoding device 101 generates the systematic portion U, the parity bits 1P, the systematic portion $U^{int}$, and the parity bits 2P. A pair of the systematic portion U and the parity bits 1P (U, 1P) is called a first elemental code E, and a pair of the systematic portion $U^{int}$ and the parity bits 2P ($U^{int}$, 2P) is called a second elemental code $E^{int}$.

The turbo decoding has two features of (1) using a plurality of systematic encoders having a relatively simple and small structure, and (2) each encoder being connected to the information bits as an input to the encoder through the interleaver (rearranging element).

The feature (2) aims to generate different codeword sequences in different encoders by inputting the information bits with rearranged sequences to the encoder. The decoded result of each codeword is thus complemented between the codewords in the decoding side to thereby improve the error correction capability.

The feature (1) aims to use information bits for mutual complementation of decoded results between codewords. For example, the 3GPP (3rd Generation Partnership Project) mandates the use of two 8-state Systematic Convolutional Coders as the feature (1). The 3GPP is working on the standardization of the third-generation mobile communication system such as W-CDMA.

A pair of outputs {U, 1P} of an encoder 102 in FIG. 8 is called a first elemental code, and the other pair of outputs {$U^{int}$, 2P} is called a second elemental code. The bit $U^{int}$ is not actually output, and three bits of U, 1P, and 2P are output to the subsequent stage. Although termination bits are actually output at the same time, they are ignored for simplification of the description. On this account, the coding rate of turbo codes defined by the 3GPP standard is ⅓.

Decoding such encoded turbo codes is called turbo decoding. In the turbo decoding process, decoding is performed iteratively as exchanging extrinsic information between a first decoder for decoding the first elemental code E and a second decoder for decoding the second elemental code $E^{int}$. The number of decoders is not limited to two, and two or more stages of decoders may be used in accordance with the number of elemental codes of the turbo codes.

FIG. 9 shows a typical decoding device for turbo decoding. The turbo decoding has one feature of (1) iterating the processing as exchanging the extrinsic information among a plurality of elemental codes.

As shown in FIG. 9, a typical decoding device 201 includes a first decoder 202, a second decoder 203, an interleaved memory 204, a de-interleaved memory 205, and a hard decision/CRC decision section 206.

The turbo decoding process in the decoding device 201 having such a configuration includes the following steps.

(A) Reading extrinsic information of the second decoder 203 from the de-interleaved memory 205 and inputting the extrinsic information and a first elemental code to the first decoder 202. Then, outputting extrinsic information from the first decoder 202 and writing it to the interleaved memory 204.

(B) Reading the extrinsic information of the first decoder 202 from the interleaved memory 204 and inputting the extrinsic information and a second elemental code to the second decoder 203. Then, outputting extrinsic information from the second decoder 203 and writing it to the de-interleaved memory 205.

(C) In the final iteration of the decoding process, reading a log likelihood ratio LLR of the second decoder 203 from the de-interleaved memory 205, making the hard decision in the hard decision/CRC decision section 206, and finally performing error checking by CRC.

In the turbo decoding process, the step (A) is performed first. The extrinsic information from the second decoder 203 is an initial value (=0) in this step. Then, the step (B) is performed and further the step (A) is performed again. Subsequently, the steps (B) and (A) are iterated an arbitrary number of times. In the final iteration, the step (B) is performed. At this step, the second decoder 203 outputs the log likelihood ratio rather than the extrinsic information. After that, the step (C) is performed finally.

Because the turbo codes are systematic bits, the information bits U are contained in a received sequence. The extrinsic information is a value (priori value) indicating the likelihood of "0" (equivalent with the likelihood of "1"), which is predefined for the information bits U prior to the decoding. The turbo decoding is the process that exchanges (mutually complements) the probability that each information bit is "0" in the decoding between the first and second elemental codes to thereby improve the accuracy of the probability and enhance the error correction capability.

The extrinsic information can be generated from the output of a soft-output decoder (log likelihood ratio LLR). There are two types of generating the soft output: MAP and SOVA. The MAP algorithm is generally more widely used because of its higher error correction capability. MAP, Log-MAP, and Max-Log-MAP are mainly known as the MAP algorithm.

Prior to describing the MAP, Log-MAP, and Max-Log-MAP algorithms, the log likelihood ratio LLR is described hereinbelow. Just like the extrinsic information, the log likelihood ratio LLR also indicates the likelihood of "0" of the information bits U. Though the extrinsic information is a priori value, the log likelihood ratio LLR is called a posteriori value. The log likelihood ratio is represented by the following Expression 1:

Log likelihood ratio:  (1)

$$L(u_k) = \log\left(\frac{P(u_k = +1 \mid y)}{P(u_k = -1 \mid y)}\right)$$

P ( ) indicates a probability,
$u_k$ indicates a k-th information bit,
y indicates a received sequence,
$P(u_k=+1|y)$ indicates a probability that the k-th information is +1(="0") when receiving the received sequence y, and
$P(u_k=-1|y)$ indicates a probability that the k-th information is −1(="1") when receiving the received sequence y.

$$\hat{u}_k = \text{sign}[L(u_k)] \quad (2)$$

where sign [ ] indicates a hard decision.

The log likelihood ratio LLR is represented by Expression 1. In this expression, "0" is represented by +1, and "1" is represented by −1. The log ratio of the probability of being "0" and the probability of being "1" is used to obtain a likelihood which indicates either "0" or "1" is more likely. If the probability of being "0" is higher than the probability of being "1", the ratio of those probabilities is larger than 1, and the log ratio is larger than 0 (positive number). On the other hand, if the probability of being "1" is higher than the probability of being "0", the ratio of those probabilities is a value below the decimal point which is less than 1, and the log ratio is smaller than 0 (negative number). Accordingly, the probability of being either "0" or "1" can be determined from the sign (positive or negative) of the log likelihood ratio. If the probability of being "0" and the probability of being "1" are equal, their ratio is 1 and the log ratio is 0, thus being unclear as to which probability is higher.

Expression 2 represents the log likelihood ratio LLR in regard to the k-th information bit $u_k$. The $\hat{u}_k$ in Expression 2 is an estimate for the k-th information bit in the receiving side, which is a result of the hard decision of LLR (="0" or "1"). The hard decision sign [ ] is the processing of retrieving a sign binary bit, and it indicates "0" if the value is positive or "1" if the value is negative. Therefore, Expression 2 represents the hard decision of LLR for the k-th information bit.

The MAP, Log-MAP, and Max-Log-MAP algorithms are described hereinafter.

MAP (Maximum A Posteriori Probability) Algorithms

MAP, which stands for Maximum A posteriori Probability, is a decoding algorithm for maximizing LLR that is a posteriori value (A posteriori probability) and also called a Maximum a posteriori probability decoding.

The MAP algorithm calculates a log likelihood ratio $L(u_k)$ using the following Expression 3 which is a result of several formula conversions on the above Expression 1. In this expression, γ indicates a transition probability of trellis, α indicates an achievement probability to each state of trellis upon transition from the starting point to the endpoint, and β indicates an achievement probability from the endpoint reversely. The trellis is a state transition diagram of an encoder deployed on the time base. This is called a trellis diagram.

$$\text{Log likelihood ratio } L(u_k) = \log\left(\frac{\sum_{S+} \tilde{\alpha}_{k-1}(s') \cdot \gamma_k(s' \cdot s) \cdot \tilde{\beta}_k(s)}{\sum_{S-} \tilde{\alpha}_{k-1}(s') \cdot \gamma_k(s' \cdot s) \cdot \tilde{\beta}_k(s)}\right) \quad (3)$$

In the MAP algorithm, Viterbi decoding is performed using the trellis diagram (state transition diagram). The path connecting each state at each time point on the trellis diagram corresponds to the coded sequence to be decoded. The likelihood (path metric) for the possible path is calculated, and the path with the highest likelihood is decoded as a survival path.

The trellis diagram is described first of all. FIG. 10 is a view showing a recursive convolutional encoder for outputting recursive convolutional codes. FIG. 11 is a schematic diagram showing the state transition thereof.

In the recursive convolutional encoder, the values stored in D1 and D2 vary by input bits supplied through the input INPUT. In the recursive encoder, the output of D2 is forwarded to the input INPUT side, thereby realizing the recursive convolutional encoding. FIG. 11 shows the state transition diagram of the possible values of the D1 and D2, i.e. (00), (01), (10), and (11). In FIG. 11, 0/0 indicates input bit/output bit, for example. The values of D1 and D2 transit according to the input bits "0" or "1" through the input INPUT. For example, when (D1 D2) is (00), the convolutional encoder outputs "0" through the output OUTPUT if "0" is input through the input INPUT, and the D1 and D2 return to the state (00). If, on the other hand, "1" is input, the convolutional encoder outputs "1", and the D1 and D2 shift to the state (10).

FIG. 12 is a trellis diagram that the state transition diagram of FIG. 11 is deployed on the time base. In FIG. 12, the solid line arrow indicates the state transition of D1 and D2 when the input bit is "0", and the broken line arrow indicates the state transition of D1 and D2 when the input bit is "1". The horizontal axis represents the time base, and k−1 and k indicate given timings.

The process of performing Viterbi decoding in the forward direction on the trellis diagram to thereby calculate a path metric is called the forward process. The process of performing Viterbi decoding in the opposite direction from the forward process to thereby calculate a path metric is called the backward process. A path metric value which is calculated in the forward process is called a path metric, and a path metric value which is calculated in the backward process is called β path metric. γ indicates the probability of transition from a certain state (e.g. state (11)) at timing (k−1) to a certain state (e.g. state (11)) at timing k, which is called branch metric. The values α and β indicate the probability of being the relevant state (e.g. state (11)) at timings (k−1) and k. A log likelihood ratio LLR is calculated from the a path metric, the β path metric, and the branch metric (γ).

FIG. 13 is a view to describe the way of calculating the transition probability using the trellis diagram. The calculation formula for the values α and β are shown below as Expressions 4 and 5. As described above, the value γ indicates the transition probability in each state at a certain time point on the trellis. The value α, which is represented by the following Expression 4, indicates the achievement probability to each state in the forward direction (i.e. the direction from the starting point to the endpoint on the trellis diagram), and it is the summation of γ in the forward direction. The value β, which is represented by the following Expression 5, is the summation of γ in the backward direction (i.e. the direction from the endpoint to the starting point).

Achievement probability: (4)
$$\tilde{\alpha}_k(s) = \sum_{s' \in S} \tilde{\alpha}_{k-1}(s') \cdot \gamma_k(s', s)$$

Achievement probability: (5)
$$\tilde{\beta}_{k-1}(s') = \sum_{s \in S} \tilde{\beta}_k(s) \cdot \gamma_k(s', s)$$

If, for example, $\alpha_k(00)$ indicates the achievement probability in the forward direction existing in the state (00) at timing k (which is referred to hereinafter as the state $(00)_k$), $\alpha_k(00)$ is a sum of a product of $\alpha_{k-1}(00)$ and a transition probability $\alpha_k(00, 00)$ from the achievement probability $\alpha_{k-1}(00)$ in the state $(00)_{k-1}$ to the state $(00)_k$ and a product of the achievement probability $\alpha_{k-1}(01)$ in the state $(01)_{k-1}$, and a transition probability $\gamma_k(01, 00)$ from the state $(00)_{k-1}$ to the state $(00)_k$, as shown in FIG. 13 and Expression 4.

Further, if $\beta_{k-1}(00)$ indicates the achievement probability in the backward direction existing in the state (00) at timing k−1 (which is referred to hereinafter as the state $(00)_{k-1}$), $\beta_{k-1}(00)$ is a sum of a product of $\beta_{k-1}(00)$ and a transition probability $\gamma_k(00, 00)$ from the achievement probability $\beta_{k-1}(00)$ in the state $(00)_{k-1}$ to the state $(00)_k$ and a product of the achievement probability $\beta_{k-1}(01)$ in the state $(01)_{k-1}$, and a transition probability $\gamma_k(00, 10)$ from the state $(00)_{k-1}$ to the state $(10)_k$, as shown in FIG. 13 and Expression 5.

In Expressions 4 and 5, α(s) and β(s) indicate the path metric in the present state s and the previous state s', and γ(s', s) indicates the probability of state transition from s' to s.

FIG. 14 is a view to describe the way of calculating the log likelihood ratio LLR from the values α, β, and γ. As shown in FIG. 14, the multiplication of the achievement probability α in the forward direction, the achievement probability β in the backward direction, and the transition probability γ between states gives the transition probability at the relevant time point in consideration of all time points on the trellis. The product of the transition probability corresponding to the input "0" is δ0, and the product of the transition probability corresponding to the input "1" is δ1. The log ratio of δ0 and δ1, i.e. log (δ0/δ1), is the log likelihood ratio LLR represented by the above Expression 3.

The log likelihood ratio and the extrinsic information satisfy the following Expression 6. Specifically, the turbo decoding process calculates the extrinsic information by subtracting intrinsic information from both sides of Expression 6 representing the log likelihood ratio LLR. Log likelihood ratio:

$$L(u_k) = L_c y_k^s + L^e(u_k) + \log\left(\frac{\sum_{S+} \tilde{\alpha}_{k-1}(s') \cdot \gamma_k^e(s' \cdot s) \cdot \tilde{\beta}_k(s)}{\sum_{S-} \tilde{\alpha}_{k-1}(s') \cdot \gamma_k^e(s' \cdot s) \cdot \tilde{\beta}_k(s)}\right) \quad (6)$$

where
$L_c$ indicates a constant determined by a transmission line,
$y_k^s$ indicates a systematic portion,
$L^e(u_k)$ indicates previous extrinsic information (priori information), $L_c y_k^s + L^e(u_k)$ indicates intrinsic information, and $$\log\left(\frac{\sum_{S+} \tilde{\alpha}_{k-1}(s') \cdot \gamma_k^e(s' \cdot s) \cdot \tilde{\beta}_k(s)}{\sum_{S-} \tilde{\alpha}_{k-1}(s') \cdot \gamma_k^e(s' \cdot s) \cdot \tilde{\beta}_k(s)}\right)$$

indicates extrinsic information.

Log-MAP algorithm (Petteri Luukkanen, "Comparison of Optimum and Sub-optimum Turbo Decoding Schemes in 3rd Generation cdma2000 Mobile System", 0-7803-5668-3/99/ $10.00, IEEE, 1999)

The Log-MAP algorithm is described below. As described above, the MAP algorithm calculates the product of the probabilities and therefore it requires a multiplier, which causes a significant increase in circuit size. Thus, in actual applications, the Log-MAP or Max-log-MAP algorithm which approximates or simplifies the probability calculation in the MAP algorithm in a log region is employed. The approximate expressions are shown in the following Expressions 7 to 11.

$$A_k(s) = \log \tilde{\alpha}_k(s) \quad (7)$$

$$B_k(s) = \log \tilde{\beta}_k(s) \quad (8)$$

$$\Gamma_k(s', s) = \log \tilde{\gamma}_k(s', s) \quad (9)$$

$$A_k(s) = \log\left(\sum_{s' \in S} \exp(A_{k-1}(s') + \Gamma_k(s', s))\right) \quad (10)$$

$$B_{k-1}(s') = \log\left(\sum_{s \in S} \exp(B_k(s) + \Gamma_k(s', s))\right) \quad (11)$$

The values α, γ, β are approximated by a log and defined as A, Γ, and B, respectively, as shown in Expressions 7 to 9 to thereby give Expressions 10 and 11 which are transformed versions of Expressions 4 and 5. However, Expressions 10 and 11 contain the items that the replacement of the calculation inside the parentheses exp. with $A_i$ results in Expression 12 below, which poses a problem in actual applications. Thus, Expression 12 is further decomposed into Expression 13 below.

$$\log\left[\sum_i \exp(A_i)\right] \quad (12)$$

$$\log\left[\sum_i \exp(A_i)\right] = A_M + \log\left(1 + \sum_{A_i \neq A_M} \exp(-|A_i - A_M|)\right), \quad (13)$$

$$A_M = \max_i A_i$$

In the above expressions, the value i indicates the number of paths which transit to a certain state. In the example of FIG. 13, the number of paths which transit to the state $(00)_k$ in the forward direction is 2, and $A_M$ indicates the larger one of the paths. In actuality, the calculation is performed on the basis of Expression 13. This is the Log-MAP algorithm. Particularly, a typical technique implements decoding with LUT by setting the second term of the right side of Expression 13 to log $(1+e^{-x})$. A technique of making a further approximation with a fixed value or −ax+b is also known. The operation of log $(1+e^{-x})$ addition is sometimes particularly called Log-sum. The item $|A_i - A_m|$ in the second term is called the path metric value.

MAX-Log-MAP Algorithm

The Max-Log-MAP algorithm is a technique that further approximates the Log-MAP algorithm which is represented by Expressions 10 and 11 above. The approximate expressions are shown as the following Expressions 14 and 15. Specifically, in the Max-Log-MAP algorithm, the Log-sum term is eliminated from the above Expressions 10 and 11. The item max ( ) is the operation for selecting a maximum value, which is equivalent with ACS (Add Compare Select) operation in the Viterbi Algorithm. Therefore, this is a simple method with a lowest cost which enables the probability calculation to be performed using the Viterbi Algorithm.

$$A_k(s) = \log\left(\sum_{s' \in S} \exp\{A_{k-1}(s') + \Gamma_k(s', s)\}\right) \quad (14)$$
$$\approx \max_{s' \in S}(A_{k-1}(s') + \Gamma_k(s', s))$$

$$B_{k-1}(s') = \log\left(\sum_{s \in S} \exp\{B_k(s) + \Gamma_k(s', s)\}\right) \quad (15)$$
$$\approx \max_{s \in S}(B_k(s) + \Gamma_k(s', s))$$

Alexander WORM et al., "Turbo-Decoding Without SNR Estimation", IEEE COMMUNICATIONS LETTER, Vol. 4, No. 6, June 2000 describes a relationship between the algorithms such as Max-Log-MAP and Log-MAP and the SNR (Signal to Noise ratio: SN ratio). This document describes the typical Log-MAP algorithm. According to the typical Log-MAP algorithm, the SNR ($E_b/N_0$) which is shown below appears in the $\Gamma$ (BM: BranchMetric) operation shown in the above Expression 9 and the operation of a transmission line constant Lc.

$$\gamma_k^e(s',s) = \exp(1/(2 \cdot L_c \cdot y_k^p x_k^p)) \quad (16)$$

$$L_c = 4RE_b/N_0 \quad (17)$$

FIG. 15 shows a typical Log-MAP decoder. As shown in FIG. 15, a typical Log-MAP decoder 301 includes a SNR estimator 315, a normalization section 316, a BM calculator 311, an ACS operator 312, a correction term calculator 313, and a correction operator 314. The SNR estimator 315 estimates the SNR from the received data and the normalization section 316 normalizes the estimated SNR. The BM calculator 311 calculates the branch metric BM (see the above Expression 9) from the SNR estimation value, the received data, and the extrinsic information based on the Expressions 9, 16, and 17.

The BM from the BM calculator 311 and the previous path metric PM from the correction operator 314 are input to the ACS operator 312 to thereby calculate the current path metric PM. First, the ACS operator 312 adds the BM to each of the two PM to obtain the added result $A_i$. Then the ACS operator 312 outputs the result that has the larger value (maximum value) as the current path metric PM' (=$A_M$). The ACS operator 312 also has an absolute value circuit to thereby obtain $|A_i - A_M|$, which is the absolute value of the difference between the path metric candidates $A_i$ where the BM is added to each of the two PM, as the path metric value (Path Metric Difference: PMD). Then the ACS operator 312 outputs the PMD to the correction term calculator 313.

The correction term calculator 313 calculates a Jacobian correction term shown in the Expression 13. The correction operator 314 adds the Jacobian correction term to the current path metric PM' calculated in the ACS operator 312 to thereby calculate the corrected path metric. This path metric is used in the next ACS operation while it is used with the BM to calculate the log likelihood ratio.

In the Max-Log-MAP, this coefficient can be ignored on the assumption that the extrinsic information is proportional to the SNR. However, in the operation in the Log-MAP, the coefficient of the SNR ($E_b/N_0$) cannot be ignored. Therefore, it is needed to estimate the SNR in the Log-MAP. In such a case, it is reported that the correction capability is degraded when the error between the estimation value and the actual SNR is large, which occasionally may reverse the correction capability between Log-MAP and Max-Log-MAP depending on conditions.

In addition, Mohammad Ali Khalighi, "Effect of Mismatched SNR on the Performance of Log-MAP Turbo Decoder", IEEE TRANSACTIONS ON VEHICULAR TECHNOLOGY, Vol. 52, No. 5, September 2003 describes a method for performing the SNR estimation in parallel with the Max-Log-MAP at the first time and performing the Log-MAP using the SNR estimation value from next time.

In addition, S.-J. Park, "CombinedMax-Log-MAP and Log-MAP of turbo codes", IEEE ELECTRONICS LETTERS, Vol. 40, No. 4, 19 Feb. 2004 discloses a technology for using the phenomenon that the correction capability of the Max-Log-MAP and the correction capability of the Log-MAP are reversed depending on the SNR error. The case in which the reverse phenomenon occurs is determined by employing an error detection approach which is different indicator from the SNR estimation. Then during the iteration, the Max-Log-MAP or the Log-MAP is selected and switched.

Further, Chun Ling KEI, Wai Ho MOW, "A Class of Switching Turbo Decoders against Severe SNR Mismatch", 0-7803-7467-3/02/$17.00, IEEE, 2002 discloses a technology for switching the Max-Log-MAP and the Log-MAP.

Further, Japanese Unexamined Patent Application Publication No. 2004-147329 discloses a technology for estimating a signal to interference power ratio (SIR), detecting the degradation of the correction capability depending on the estimation result, and selecting one of the Max-Log-MAP and the Log-MAP to thereby use the selected algorithm.

However, in the method described in Alexander WORM et al. and in Mohammad Ali Khalighi the operation of the SNR estimation and the operation using the estimated SNR are needed, which increase an amount of the operation and the process time. The SNR estimation is the process for estimating the signal-noise ratio and determining how much noise is included in the received signal. The general expression is shown below. However, the estimation is quite difficult because there are many kinds of noise and an optimal SNR estimation algorithm varies depending on the operational system.

SNR=10 log (PS/PN),
PN indicates a noise power [W], and
PS indicates a signal power [W].

In addition, in the method described in Alexander WORM et al., the error correction capability is degraded depending on conditions if the SNR estimation is not performed. It is true that the degradation of the correction capability also occurs by the SNR estimation error as well. However, further operation may be needed to improve the accuracy of the SNR estimation. On the other hand, in the method described in Mohammad Ali Khalighi, it is true that the process time is shortened because there is no overhead of the SNR estimation process. However, the correction capability can be degraded because this method employs the Max-Log-MAP at the first time.

Further, in the method described in S.-J. Park, the error detection process is needed. In addition, S.-J. Park and Chun Ling KEI, Wai Ho MOW both use the Max-Log-MAP, so their correction capability are low.

Further, in the method described in Japanese Unexamined Patent Application Publication No. 2004-147392, the SNR value is needed for the operation of the Log-MAP. In addition, the Jacobian correction term is calculated from the expression $\log(1+e^{-|x-y|})$, and the calculated value is directly used without adding any modification. Therefore, the amount of operation increases due to the SNR estimation in the Log-MAP. As stated above, the SNR estimation is a process to determine how much noise is included in the received signal. However, there are many kinds of noise, so it is difficult to select the optimal SNR estimation algorithm. Therefore, the SNR estimation is quite difficult.

In addition, it is needed to estimate the SNR in advance, which causes the overhead process and delays the process time. Moreover, the performance of the error correction is degraded when the SNR error is large. If the SNR estimation accuracy is tried to be improved in this condition, the amount of the operation can further be increased.

SUMMARY

According to the present invention, there is provided a decoding device including: an ACS operator calculating a path metric value corresponding to received data to be decoded; and a correction unit performing a correction of the path metric value, wherein the correction unit adjusts degree of the correction based on the received data.

According to the present invention, there is provided a decoding method including: adjusting a path metric value relative to a sate on a trellis diagram, the path metric value being adjusted based on received data corresponding to the path metric value.

According to the present invention, it is possible to provide a decoding device and a decoding method that are capable of reducing a degradation of a correction capability of a Log-MAP.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 4 is a view to describe an operation of each block in the decoding device according to the embodiment of the present invention;

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

A specific embodiment to which the present invention is applied will be described in detail below with reference to the drawings. The present embodiment is the one in which the present invention is applied to a turbo decoding device employing a Log-MAP algorithm.

As described above, the Log-MAP needs a value of SNR ($E_b/N_0$) for operation as shown in the Expressions 6, 16, and 17. However, there are many kinds of noise, and an optimal SNR estimation algorithm varies depending on operational systems. Therefore, estimating the SNR is not easy.

In the present embodiment, a fixed value is used for the SNR. The value of the SNR can be determined based on aBLER (block error rate) which is targeted. For example, in a case of packet data, a transmission power is adjusted so that the BLER is approximately $10^{-1}$ to $10^{-2}$ when a WCDMA (Wideband Code Division Multiple Access) is performed. This operation is performed to adjust the BLER to meet the target by increasing the transmission power when there are many noises, to thereby keep the SNR within a certain range. In addition, in the present embodiment, punctured codes are employed to adjust a code length. In the present embodiment, explanation is made for the case in which a SNR fixed value and the punctured codes are employed to show a remarkable effect of the present invention. However, the present invention can be applied to a case as well where the SNR estimation is performed or the puncturing is not performed.

Figure 1:
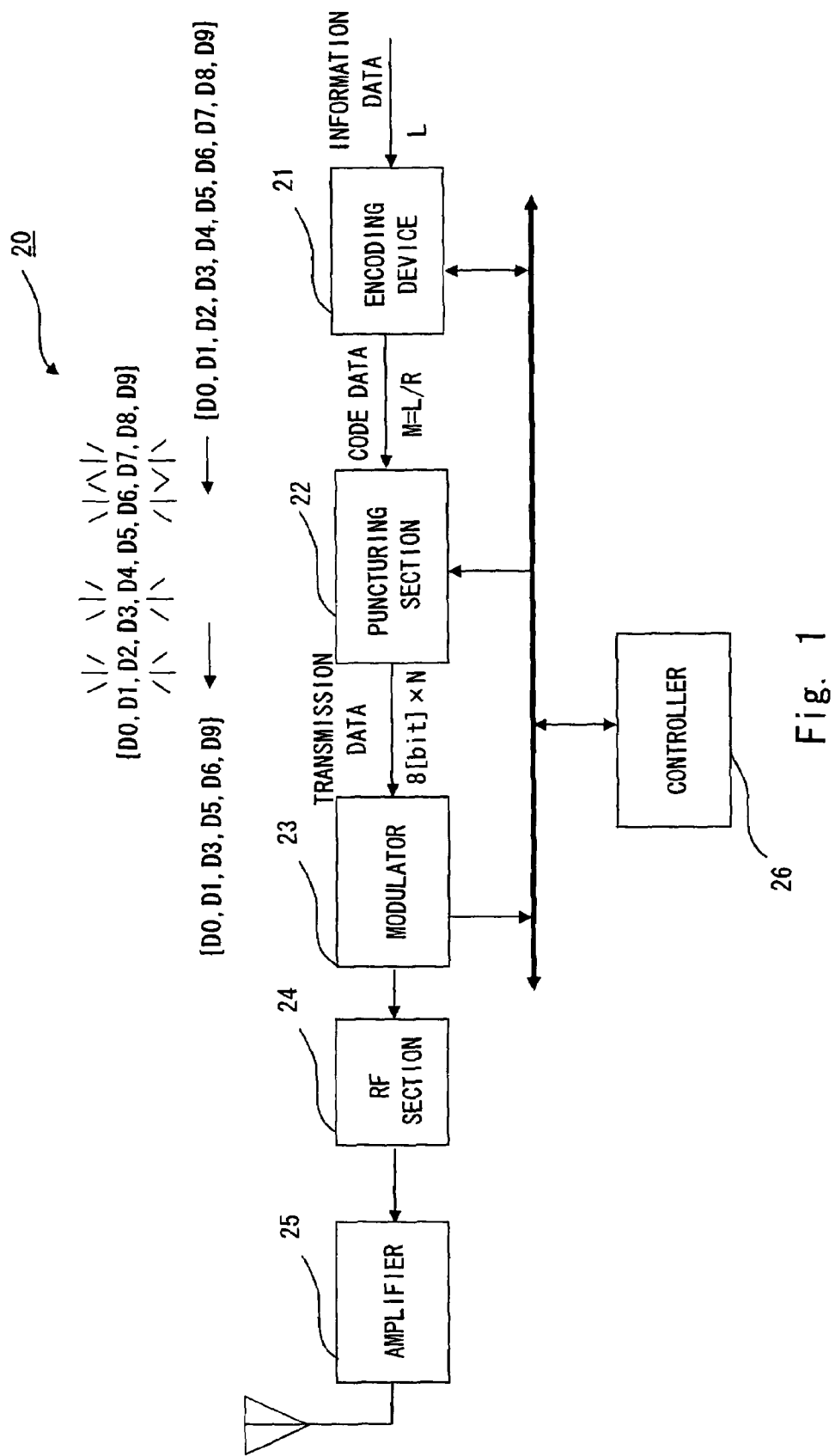
FIG. 1 is a block diagram showing a transmission device according to the embodiment of the present invention.
Figure 2:
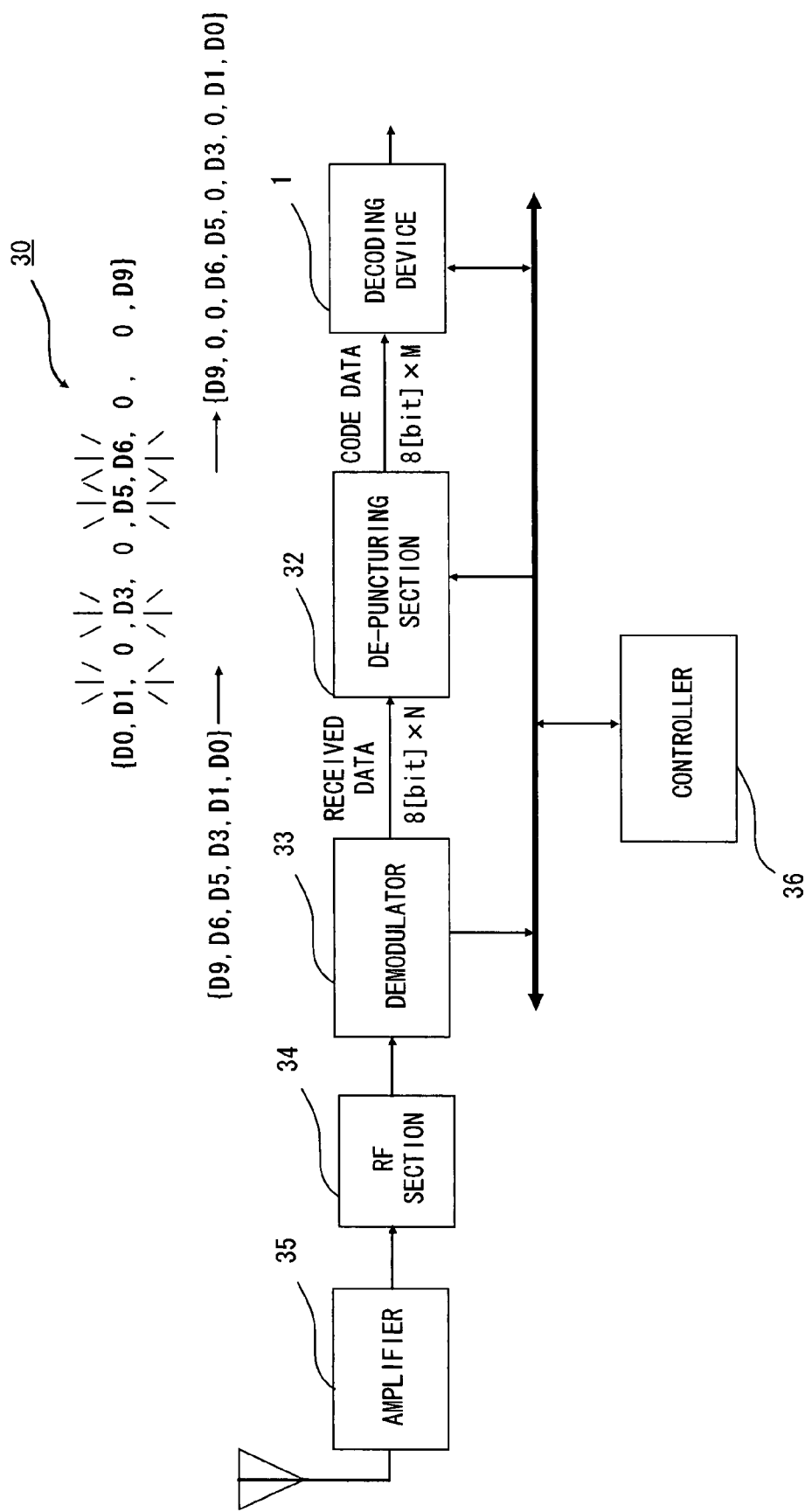
FIG. 2 is a block diagram showing a receiving device according to the embodiment of the present invention.

First, a puncturing will be explained. FIGS. 1 and 2 are block diagrams showing a transmission device and a receiving device, respectively. A transmission device 20 has a coding device 21, a puncturing section 22, a modulator 23, an RF section 24, an amplifier 25, and a controller 26, and soon. Now we assume the number of information is L and a coding rate R is ⅓. Then the transmitting side performs the puncturing (eliminates the data) so that the number of the data after being coded becomes L/R=M and the number of data decreases from M to N.

For example, we assume that there are transmission data D0 to D9 and that the data D2, D4, D7, and D8 are deleted by puncturing. In such a case, the ultimate transmission data is D0, D1, D3, D5, D6, and D9. The transmission data of which some of the data is punctured is transmitted as N data through the modulator 23, the RF section 24, and the amplifier 25.

In addition to the decoding device 1, a receiving device 30 further includes a de-puncturing section 32, a demodulator 33, an RF section 34, an amplifier 35, and a controller 36 for controlling these elements and so on, as shown in FIG. 2. The receiving device 30 basically performs the process that is opposite to the transmitting side.

In the receiving apparatus 30, the received data received by the antenna is supplied to the amplifier 35. The amplifier 35 amplifies the received data and supplies the amplified data to the RF section 34. The RF section 34 performs high frequency processing such as high frequency conversion and supplies the processed received data to the demodulator 33 for demodulation. For example, each N symbol data that is transmitted has a value range of 8 [bit] after being demodulated. In other words, one symbol data after being received is 8 [bit] and N pieces of 8 [bit] data are received. The received data which is demodulated is then supplied to the de-puncturing section 32. The de-puncturing section 32 performs the de-interleaving which is reverse to the interleaving performed in the transmitting side to thereby restore the original data sequence and further performs the de-puncturing which inserts 0-bit to the position of data which is eliminated upon transmission to thereby restore the original data length. In the above example, 0-bit is inserted to each of the D2, D4, D7, and D8 and de-puncturing is performed to restore the M pieces of 8 [bit] data. The data having the original data length as a result of the de-puncturing is supplied to the decoding device 1 for turbo decoding to obtain 1 [bit] data to thereby obtain a hard decision decoding result. The controller 36 controls the timing to supply data to the decoding device 1, for example.

Figure 3:
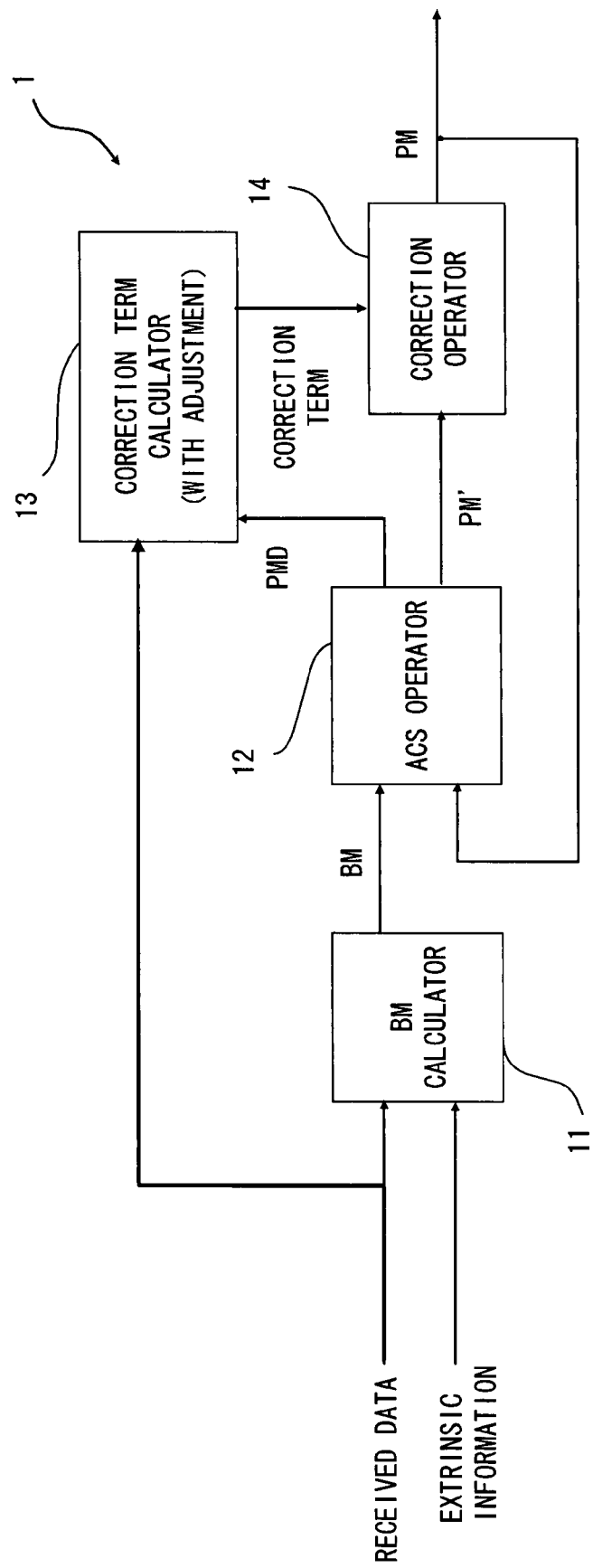
FIG. 3 is a view showing a decoding device according to the embodiment of the present invention.

The decoding device 1 will now be described. FIG. 3 is a view showing a decoding device according to the present embodiment. As shown in FIG. 3, the decoding device 1 according to the present embodiment includes a BM calculator 11, an ACS operator 12, a correction term calculator 13, and a correction operator 14. The decoding device 1 is prepared separately for a forward process and a backward process. In this specification, the decoding device in the forward process section is described.

The BM calculator 11 calculates a branch metric BM (see above Expression 9) from the received data and extrinsic information. As stated above, in the present embodiment, the SNR ($E_b/N_0$) used for the operation of the branch metric is calculated as the fixed value that is decided based on the targeted BLER (block error rate) By having such a configuration, a SNR estimation circuit and the normalization circuit section that have been necessary in the related technique is not needed, which makes it possible to reduce the hardware volume.

The BM from the BM calculator 11 and the previous path metric PM from the correction operator 14 which will be described below are input to the ACS operator 12 to thereby calculate the current path metric PM. First, the ACS operator 12 adds the BM to each of the two PM to obtain the added result (hereinafter referred to as path metric candidate) $A_i$. Then the ACS operator 12 outputs the result that has the larger value (maximum value, see FIG. 4) as the current path metric PM' ($=A_M$) The ACS operator 12 also has an absolute value circuit to thereby obtain $|A_i - A_M|$, which is the absolute value of the difference between the path metric candidates $A_i$ where the BM is added to each of the two PM, as the path metric value (Path Metric Difference: PMD). Then the ACS operator 12 outputs the PMD to the correction term calculator 13.

The correction term calculator 13 calculates a Jacobian correction term (see FIG. 4) shown in the above Expression 13. The correction term calculator 13 according to the present embodiment performs adjustment of the correction term depending on the amplitude of the received signal, in other words depending on the size of the received data (see FIG. 4). This correction adjustment method will be described below in detail.

The correction operator 14 adds the adjusted correction term to the current path metric PM' calculated in the ACS operator 12 to thereby calculate the corrected path metric. This path metric is normalized properly to be used in the next ACS operation while it is used to calculate the log likelihood ratio with the BM and the path metric of the backward process.

The correction term adjustment method of the decoding device according to the present embodiment will now be described. As stated above, the Log-MAP is the one that the correction term is added to the MAX-Log-MAP. Therefore, the MAX-Log-MAP means that Jacobian correction is not performed in the Log-MAP. Therefore, the Log-MAP has a higher error correction capability than the Max-Log-MAP. However, under certain conditions, the error correction capability of the MAX-Log-MAP is higher than that of the Log-MAP. The present inventors have found the method for obtaining the optimal error correction result by adjusting a degree of the Jacobian correction depending on the size of the received data (received value) in the Log-MAP.

Many reports of IEEE documents have indicated that the correction capability of the Max-Log-MAP becomes higher than that of the Log-MAP when the SNR estimation error is large. In the present embodiment, the puncturing is performed and the SNR fixed value is employed. Therefore, as described above, the insertion of 0 is necessary at the position of the puncture bit in the receiving side. This is approximately a medium value of the −128 to +127 which is the value range of each data value. The amplitude in the position of the puncture bit becomes minimum, which means it is equivalent to the fact that a large amount of noise is included. In such a case, difference is raised between the SNR fixed value and the apparent noise amount. This difference is regarded as the SNR estimation error, which degrades the correction capability. Therefore, the present inventors have found that the error correction capability can be improved by decreasing the correction degree of the Jacobian correction term in the position of the puncture bit when the SNR fixed value is employed.

Moreover, even in the case of the actual received value, it is also possible to improve the error correction capability by adjusting the correction amount to be small by determining that the data whose amplitude is small has a large amount of noise. In other words, in the present embodiment, the correction value is adjusted in accordance with the size of the received value. More specifically, the correction value is adjusted to be small when the received value is small (when the amplitude is small). In the present embodiment, the adjustment coefficient adjusting the value of the Jacobian correction term is introduced. However, it is also possible to perform adjustment by other methods.

Figure 5:
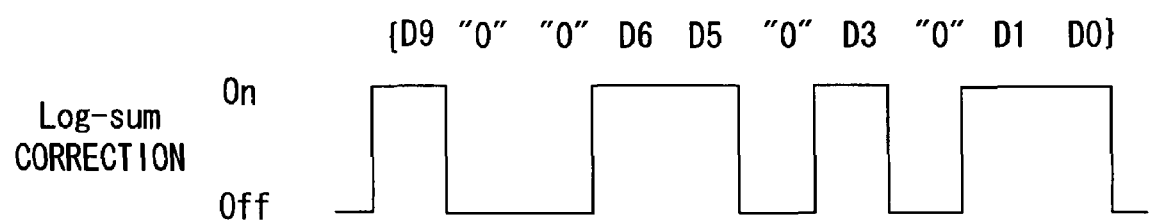
FIG. 5 is a view to describe an example of a Log-sum correction according to the embodiment of the present invention.
Figure 6A:
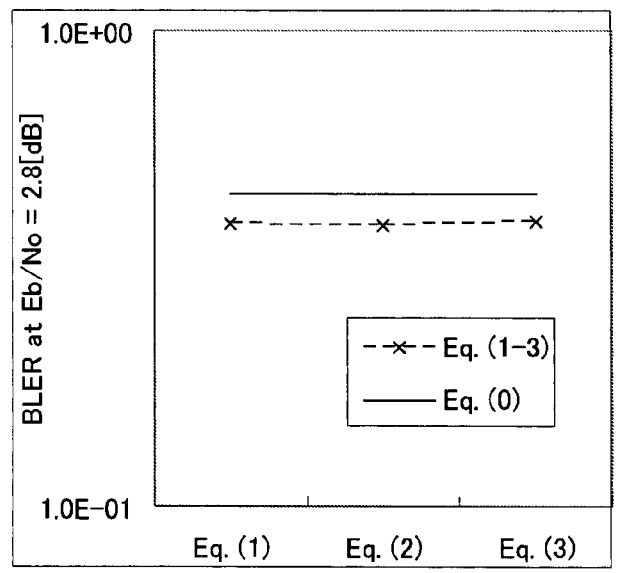
FIGS. 6A to 6C and FIGS. 7A to 7C are views showing a BLER (block error rate) when a decoding method is applied according to the embodiment of the present invention.
Figure 6B:
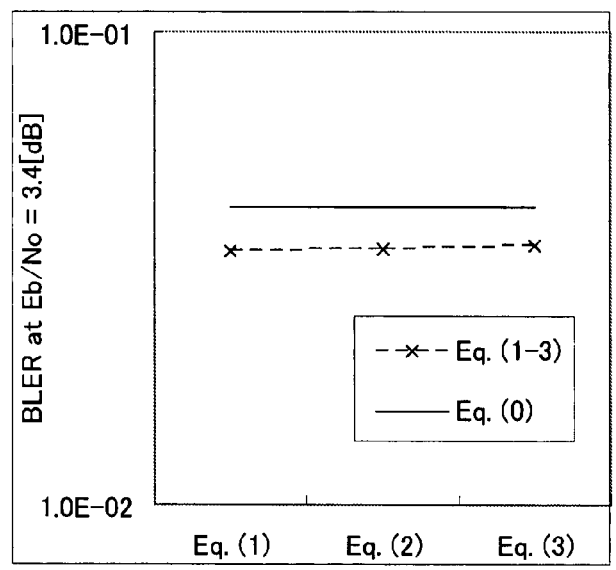
Figure 6C:
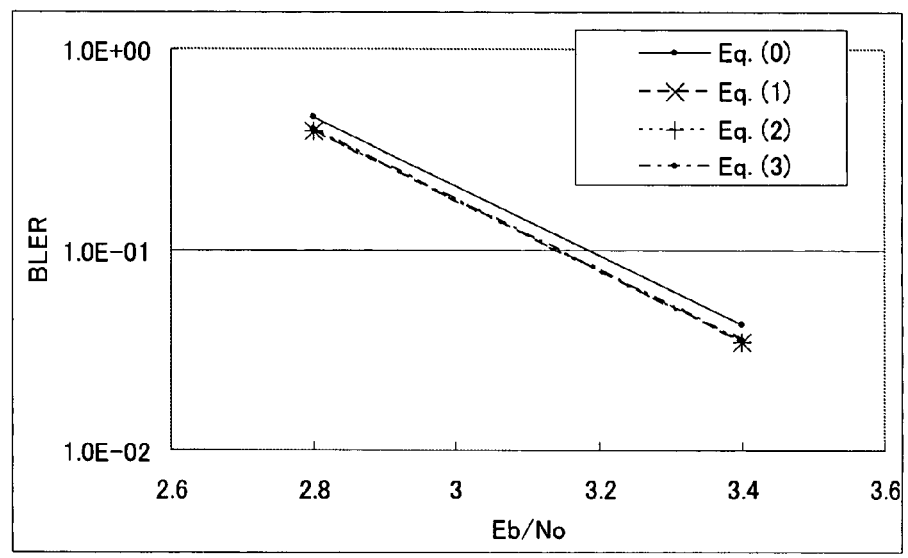

FIG. 5 is a view to describe an example of a Jacobian correction according to the present embodiment. The simplest adjustment method is the one that does not perform the Jacobian correction only at the position where the puncture bit is inserted, as shown in FIG. 5. More specifically, as in the above-described example, when there are received data of D0 to D9 and the punctured position is D2, D4, D7, and D8, the Jacobian correction is turned off at D2, D4, D7, and D8. In this case, the operation result in the MAX-Log-MAP is output to the position of data D2, D4, D7, and D8.

Figure 7A:
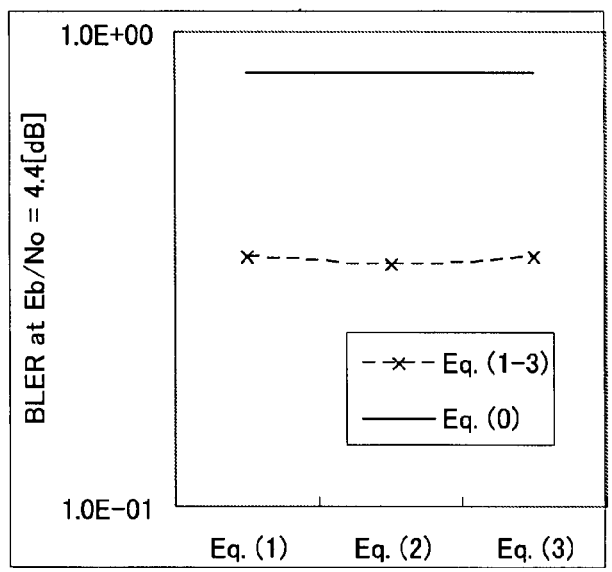
Figure 7B:
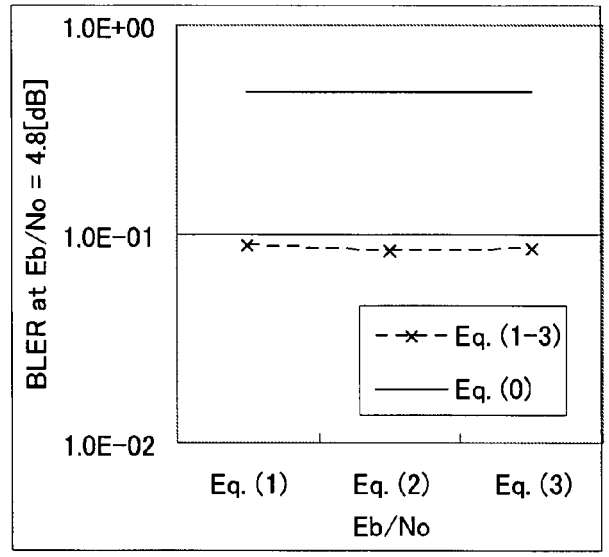
Figure 7C:
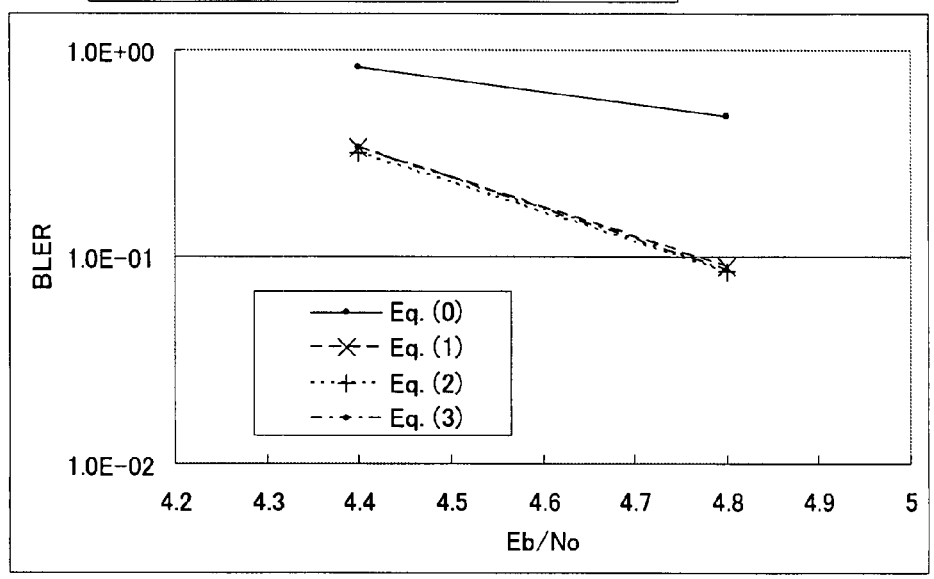
Figure 8:
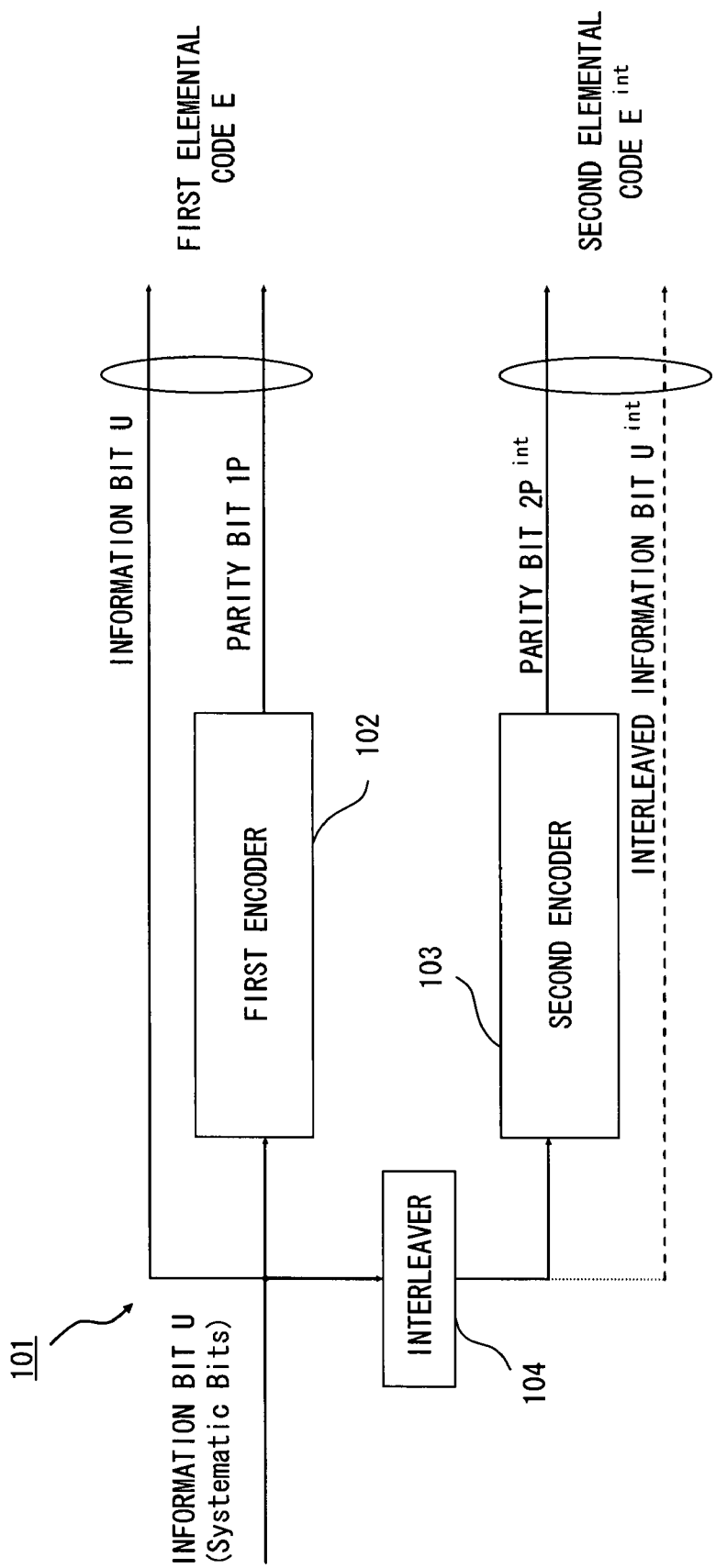
FIG. 8 is a view showing a typical encoding device for generating turbo codes.
Figure 9:
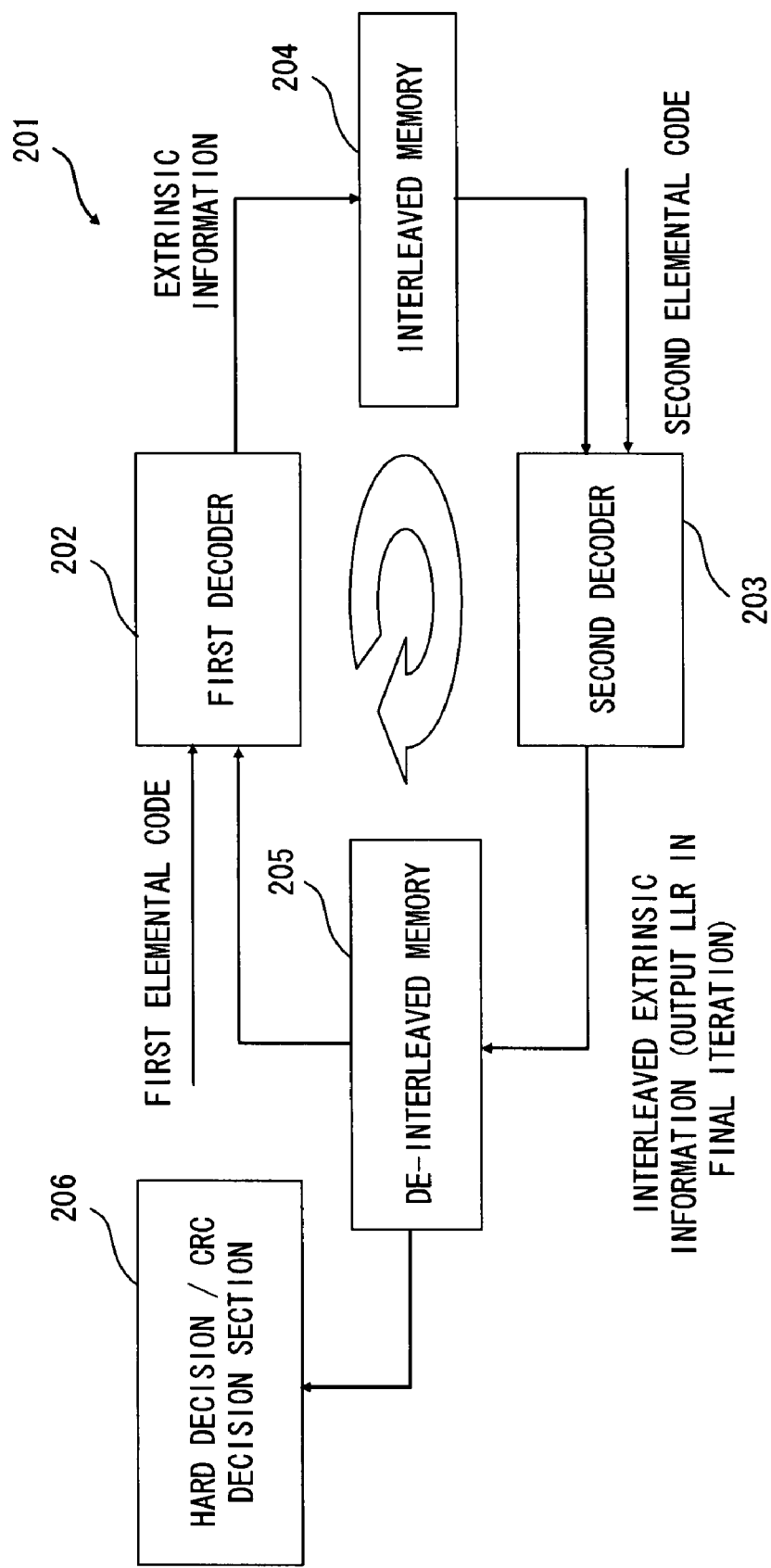
FIG. 9 is a view showing a typical decoding device for turbo decoding.
Figure 10:
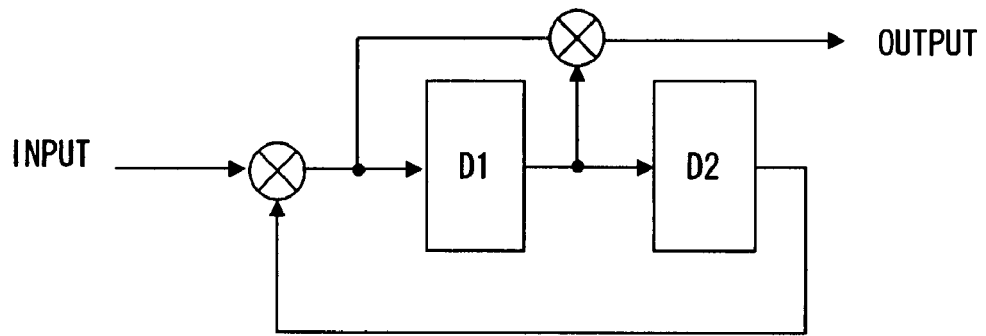
FIG. 10 is a view showing a recursive convolutional encoder for outputting recursive convolutional codes.
Figure 11:
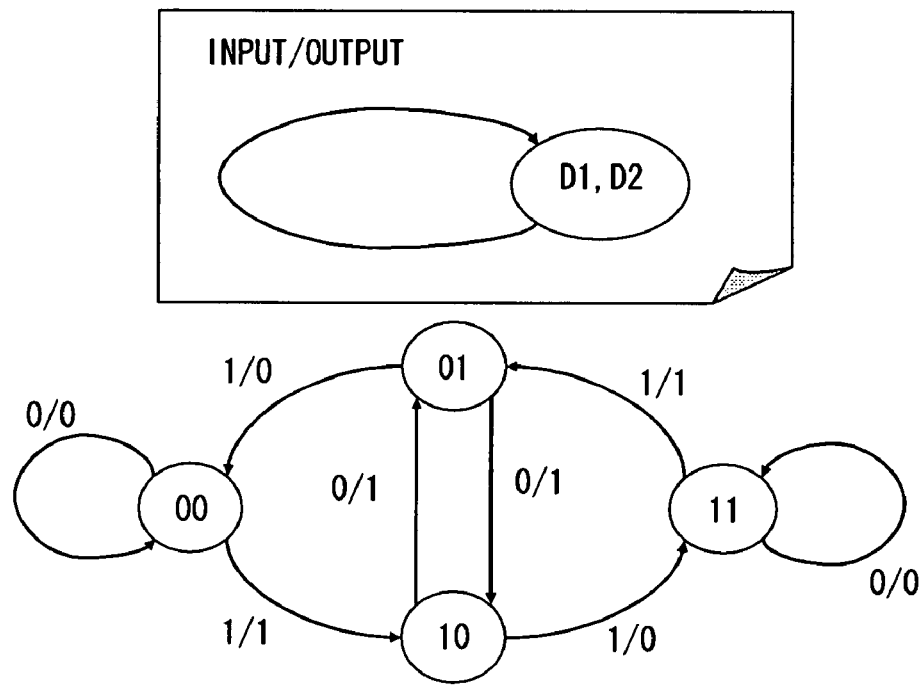
FIG. 11 is a schematic view showing the state transition of recursive convolutional codes shown in FIG. 10.
Figure 12:
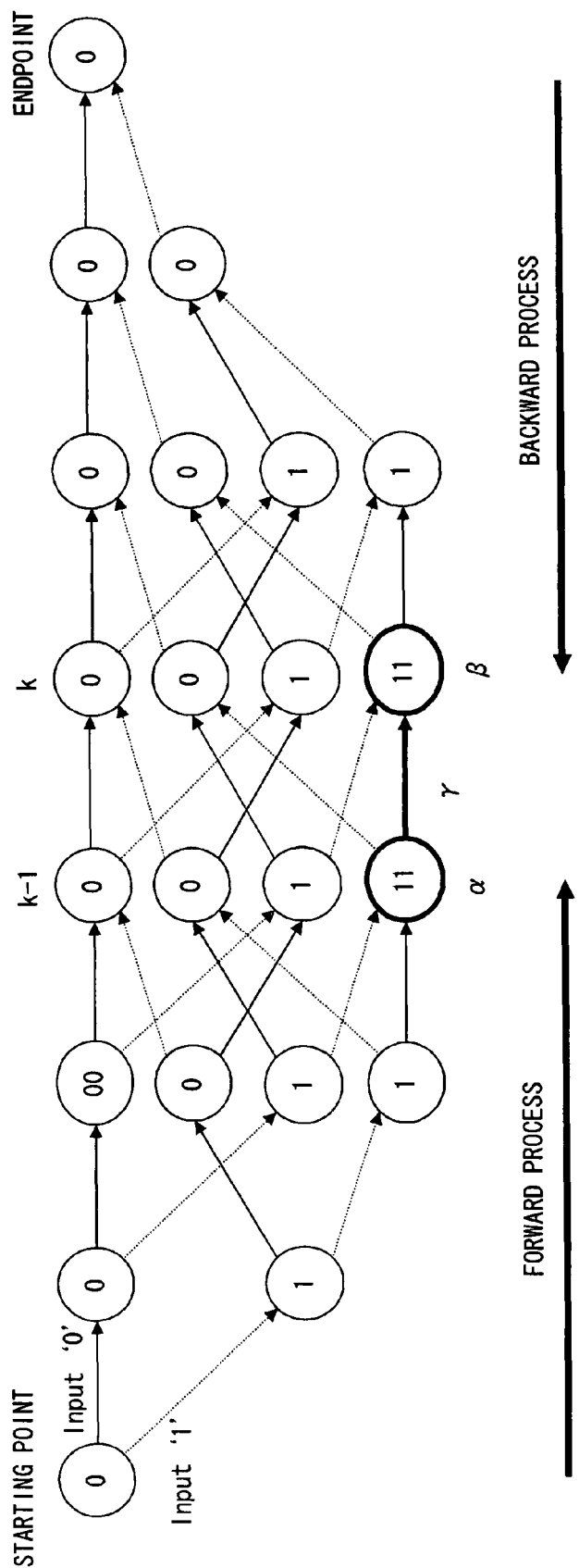
FIG. 12 is a view showing a trellis diagram.
Figure 13:
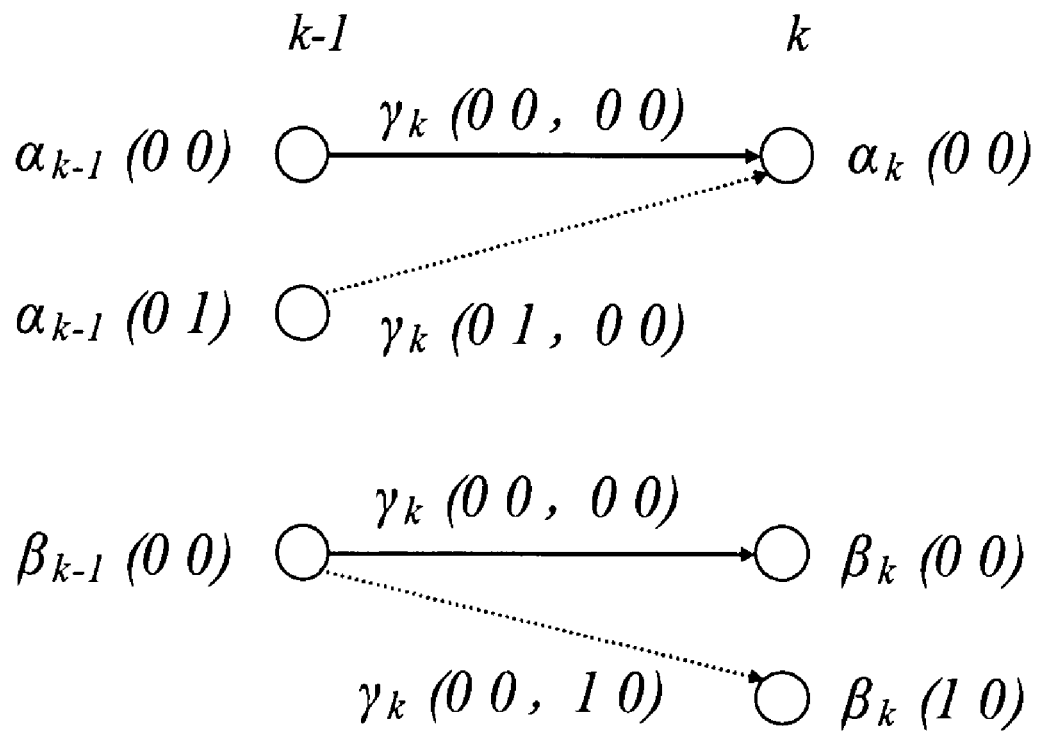
FIG. 13 is a view to describe a way of obtaining a transition probability using a trellis diagram.
Figure 14:
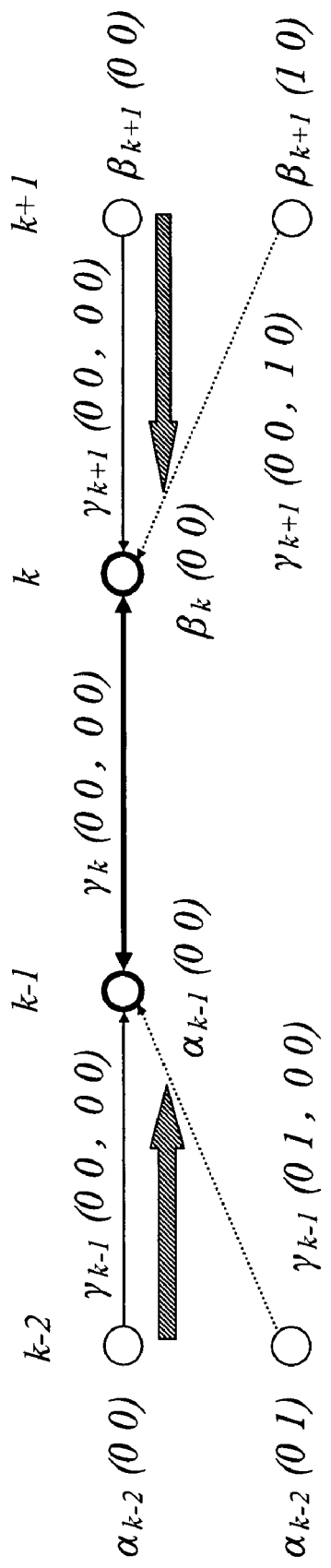
FIG. 14 is a view to describe a way of calculating a log likelihood ratio LLR from probabilities $\alpha$, $\beta$, and $\gamma$.
Figure 15:
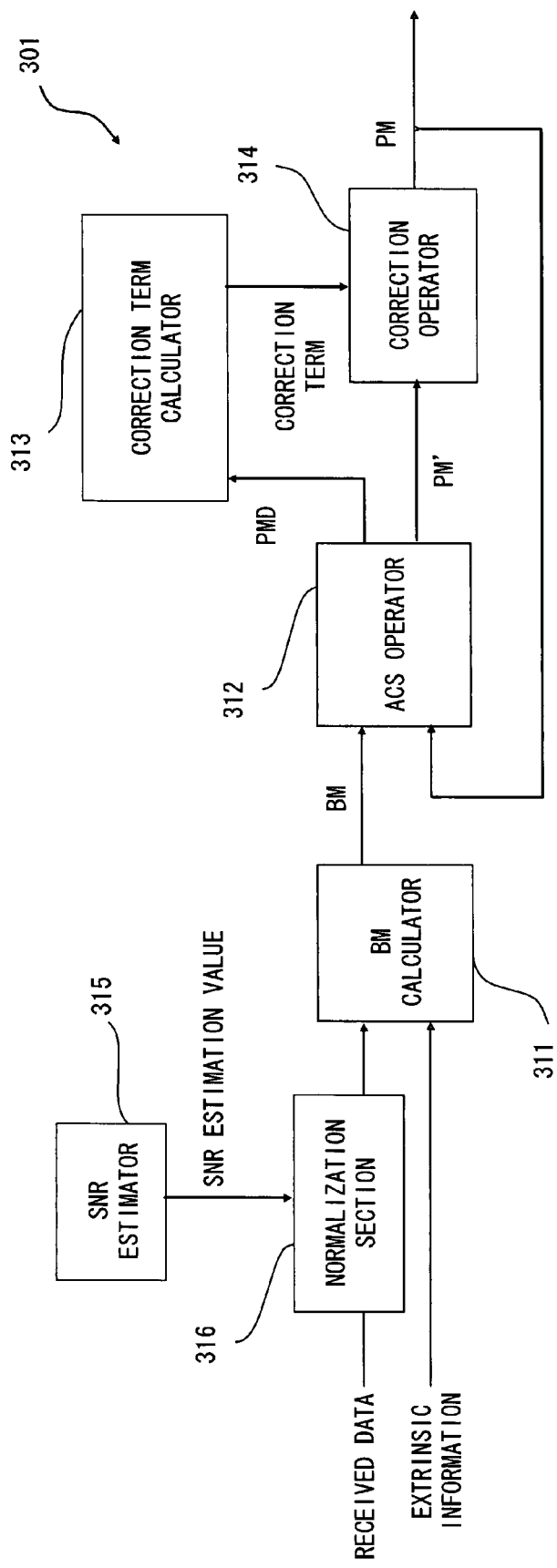
FIG. 15 is a view showing a typical Log-MAP decoder.

FIGS. 6A to 6C and FIGS. 7A to 7C are views showing a BLER (block error rate) when the SNR at the point at which the data is input to the turbo decoder is made apparently low by puncturing the parity bit by ⅓ and ½ respectively under TrCH (Transport channel) condition of which transport block (TrBK) size is 632 and CRC size is 24. As stated above, the Jacobian correction term is made small when the confidence in the received data is low, and the Jacobian correction term is made large when the confidence in the received data is high. In this example, the Jacobian correction term is adjusted to be +/−0 when the received data is +/−0. The turbo decoding has a condition that the maximum iteration times is eight. Eq (0) shows the result of the Log-MAP when the Jacobian correction term adjustment is not performed, and Eq (1) to Eq (3) show the result of the Log-MAP when the Jacobian correction term adjustment is performed. This adjustment can be expressed below as shown in FIG. 4.

$$\log\left(\sum_i e^{A_i}\right) = A_M + \log\left(1 + \sum_{A_i \neq A_M} e^{-|A_i - A_M|}\right) \times \prod_r F(x_r) \quad (18)$$

where
π indicates a multiplication,
I indicates the number of the branch connected to the 1 state at next time point,
$A_i$ indicates the path metric corresponding to the i-th branch,
r indicates an inverse number of the coding rate in one codeword sequence, and
F(x) indicates an adjustment coefficient calculation function.
In FIGS. 6A to 6C and FIGS. 7A to 7C, Eq (1) to (3) each shows the adjustment coefficient calculation function F(x) shown in Expression 19 to 21 below respectively. Eq (0) shows an example when F(x)=1, which means the adjustment is not performed. More specifically, when the ½ puncture shown in FIGS. 7A to 7C is performed, a coding gain of BLER=10⁻¹, which is the adjustment target of HSDPA (High Speed Downlink Packet Access), is improved by around 0.2 dB as can be seen in Eq (1) to Eq (3). When the SNR fixed value is employed and 0 data is inserted in puncturing as in the present embodiment, the prominent effect can be seen because the SNR degrades.

$$F(x) = \begin{cases} 0 & \text{if } (x = 0), \\ 1 & \text{else.} \end{cases} \quad (19)$$

$$F(x) = \begin{cases} 0 & \text{if } (-2 \leq x \leq 1), \\ 0.25 & \text{else if } (-4 \leq x \leq 3), \\ 0.5 & \text{else if } (-8 \leq x \leq 7), \\ 0.75 & \text{else if } (-16 \leq x \leq 15), \\ 1 & \text{else.} \end{cases} \quad (20)$$

$$F(x) = \begin{cases} 0 & \text{if } (-2 \leq x \leq 1), \\ 0.25 & \text{else if } (-4 \leq x \leq 3), \\ 1.5 & \text{else if } (-96 \leq x \leq 95), \\ 1.25 & \text{else if } (-64 \leq x \leq 63), \\ 1 & \text{else.} \end{cases} \quad (21)$$

The adjustment coefficient is set to 0 or 1. Then in the position where the puncture bit is inserted, the adjustment coefficient is set to 0 and the Jacobian correction term is not added as in Eq (1) in the Expression 19. In the position where the puncture bit is inserted, the received data is made to 0 as stated above. Therefore, it is possible to adjust the Jacobian correction term by setting the adjustment coefficient to 0 for not only the position where the puncture bit is inserted but also all the position where the received data is set to 0. In the present embodiment, we assume that 0 is inserted to the puncture bit. However, −1 may be inserted to the puncture bit. In such a case, it is possible not to add the Jacobian correction term by setting the adjustment coefficient to 0 for the data having the puncture bit or the received value of −1.

The value range of the received data is −128 to +127. When the medium value neighborhood, in other words the absolute value of the received data is small, it is considered that the confidence of the received data is low or there are many noise components. Therefore, as shown in Eq (2) and Eq (3), not in Eq (1), it is possible to set the adjustment coefficient to 0 and not to add the Jacobian correction term when the absolute value of the received value is equal to or less than the predetermined value. On the contrary, when the absolute value of the received data is larger than the predetermined value, it is considered that the confidence of the data is quite high. Then the adjustment coefficient is set to 1 and the Jacobian correction term may be directly added. The adjustment coefficient may be less than 1 or larger than 1.

It is also considered that the received value becomes partially 0 neighborhood by the normalization process due to the fading even when the puncturing is not performed. The normalization process means a process to convert the data after being demodulated into a fixed-point data of 8 bit indicating −128 to +127 between the demodulator 33 and the de-puncturing section 32. More specifically, in the normalization process, a part of data whose the order is less than the value of mantissa 8 bit is truncated in accordance with the maximum value of the demodulated data in order to regard the data whose the order is less than the value of mantissa 8 bit as 0, for example. Note that the average value can also be used instead of using the maximum value in this normalization process. In such a case, it is possible to make the Jacobian correction term of the received value at 0 neighborhood small by using the adjustment coefficient calculation function F(x) as shown in the above Eq (2), (3), and in Eq (22) below, for example.

$$F(x) = \begin{cases} 0 & \text{if } (x = 0), \\ 0.25 & \text{if } (0 < |x| \leq 2), \\ 0.5 & \text{if } (2 < |x| \leq 4), \\ 0.75 & \text{if } (4 < |x| \leq 8), \\ 1 & \text{else.} \end{cases} \quad (22)$$

As stated above, in the present embodiment, it is possible to reduce the degradation of the error correction capability in the Log-MAP by adjusting the Jacobian correction term based on the size of the received value in the Log-MAP. In this case, it is possible to improve the error correction capability while preventing the increase of the amount of operation due to the SNR estimation by employing the SNR fixed value. In addition, the hardware amount is decreased by employing the SNR fixed value, and the process speed can be improved by not employing the overhead of the process that is needed for the SNR estimation. When the SNR fixed value is employed, it is possible to improve the error correction capability in the Log-MAP in a quite simple way by making the value of the Jacobian correction term small or 0 for the data in the puncture bit position.

Note that the present invention is not limited to the above-described embodiment. Needless to say, various changes can be made without departing from the spirit of the present invention. For example, we explained that the ACS operator 12 outputs the maximum value in the above-described embodiment. However, the ACS operator 12 may output the minimum value. In this case, the correction operator 14 adds the adjusted negative Jacobian correction term to the minimum value.

In addition, we explained that the correction term calculator 13 calculates and adjusts the correction term and inputs the adjusted Jacobian correction term to the correction operator 14 in the above-described embodiment. However, needless to say, the correction operator 14 can receive, adjust, and multiply the Jacobian correction term.

In addition, although the above-described embodiment are described as hardware configuration, the present invention may be implemented by executing a computer program on a CPU (Central Processing unit) to thereby perform arbitrary processing. In such a case, a computer program may be stored in a recording medium or may be transmitted through a transmission medium such as the Internet.

It is apparent that the present invention is not limited to the above embodiment, but may be modified and changed without departing from the scope and spirit of the invention.

What is claimed is:

1. A decoding device, comprising:
   an Add Compare Select operator calculating two path metric values corresponding to received data to be decoded based on a branch metric value and outputting one of the path metric values and a path metric difference between the two path metric values;
   a correction term calculator coupled to the Add Compare Select operator to receive the path metric difference, to calculate and output a correction term based on the path metric difference and noise included in the received data, the correction term being adjusted based on a size of the received data which is not utilized for a calculation of a branch metric value; and
   a correction operator coupled to the correction term calculator and the Add Compare Select operator to receive the path metric value from the Add Compare Select operator, to receive the correction term adjusted based on the noise included in the received data from the correction term calculator, and to add the adjusted correction term to the path metric value.

2. The decoding device according to claim 1, wherein the correction term calculator adjusts the correction term by modifying an adjustment coefficient based on the received data, the correction term being multiplied by the adjustment coefficient.

3. The decoding device according to claim 1, wherein the correction term is a Jacobian correction term relative to a Log-Map algorithm.

4. The decoding device according to claim 3, wherein the path metric value and the Jacobian correction term includes a signal to noise ratio and the signal to noise ratio is a fixed value regardless of the received data.

5. The decoding device according to claim 1, wherein the correction term calculator calculates a Jacobian correction term and adjusting the Jacobian correction term based on an adjustment coefficient, and the correction operator adds the path metric value to the Jacobian correction term adjusted by the correction term calculator.

6. The decoding device according to claim 5, wherein the correction term calculator adjusting the Jacobian correction term using the adjustment coefficient being proportional to an absolute value of the received data.

7. The decoding device according to claim 5, wherein the correction term calculator adjusts the Jacobian correction term when an absolute value of the received data is equal to or less than a predetermined value.

8. The decoding device according to claim 5, wherein the correction term calculator adjusts the Jacobian correction term when the received data corresponds to a data being punctured at a data transmitting side.

* * * * *